US012683043B2

(12) United States Patent　　　(10) Patent No.:　US 12,683,043 B2
Dais et al.　　　　　　　　　　　(45) Date of Patent:　　　Jul. 14, 2026

(54) SMART ELECTRICAL BUSHING WITH INTEGRATED SENSOR

(71) Applicant: Hitachi Energy Ltd, Zürich (CH)

(72) Inventors: Ansgar Dais, Obfelden (CH); Jens Rocks, Freienbach (CH)

(73) Assignee: Hitachi Energy Ltd, Zürich (CH)

( * ) Notice: Subject to any disclaimer, the term of this patent is extended or adjusted under 35 U.S.C. 154(b) by 596 days.

(21) Appl. No.: 17/780,564

(22) PCT Filed: Nov. 25, 2020

(86) PCT No.: PCT/EP2020/083366
§ 371 (c)(1),
(2) Date: May 27, 2022

(87) PCT Pub. No.: WO2021/105210
PCT Pub. Date: Jun. 3, 2021

(65) Prior Publication Data
US 2023/0178270 A1　　Jun. 8, 2023

(30) Foreign Application Priority Data
Nov. 28, 2019　　(EP) ..................................... 19212223

(51) Int. Cl.
*H01B 17/00* (2006.01)
*G01R 31/62* (2020.01)
*H01B 17/34* (2006.01)
(52) U.S. Cl.
CPC ........... *H01B 17/005* (2013.01); *G01R 31/62* (2020.01); *H01B 17/34* (2013.01)

(58) Field of Classification Search
CPC ...... H01B 17/34; H01B 17/005; G01R 31/62; G01R 31/1281
See application file for complete search history.

(56) References Cited

U.S. PATENT DOCUMENTS

| | | | | |
|---|---|---|---|---|
| 7,575,371 | B1 * | 8/2009 | Yakymyshyn | ......... G01N 29/07 702/159 |
| 2004/0046568 | A1 * | 3/2004 | Unsworth | .......... G01R 31/1272 324/536 |
| 2009/0279581 | A1 * | 11/2009 | Yakymyshyn | ......... G01N 29/07 367/129 |

(Continued)

FOREIGN PATENT DOCUMENTS

| | | |
|---|---|---|
| CN | 102239416 A | 11/2011 |
| CN | 107209210 A | 9/2017 |

(Continued)

OTHER PUBLICATIONS

International Search Report and Written Opinion of the International Searching Authority, PCT/EP2020/083366, mailed Jan. 29, 2021, 15 pages.

(Continued)

*Primary Examiner* — Timothy J Thompson
*Assistant Examiner* — Rhadames Alonzo Miller
(74) *Attorney, Agent, or Firm* — Sage Patent Group

(57) ABSTRACT

Electrical bushing for medium and high voltage, the bushing including a fluid filled insulation volume; a sensor unit in contact with the fluid in the fluid filled insulation volume; wherein the sensor unit is configured to measure a breakdown voltage of the fluid.

20 Claims, 3 Drawing Sheets

(56)          References Cited

U.S. PATENT DOCUMENTS

| | | | | |
|---|---|---|---|---|
| 2009/0279582 A1* | 11/2009 | Yakymyshyn | ..... | G01N 29/4454 |
| | | | | 367/129 |
| 2011/0031980 A1* | 2/2011 | Kruger | ................... | G01R 31/62 |
| | | | | 324/547 |
| 2011/0301880 A1* | 12/2011 | Stenestam | .......... | G05B 19/0428 |
| | | | | 702/50 |
| 2013/0306368 A1* | 11/2013 | Eriksson | .............. | H01B 17/005 |
| | | | | 174/650 |
| 2016/0154051 A1* | 6/2016 | Watson | .............. | G01R 31/1272 |
| | | | | 324/552 |
| 2016/0238412 A1* | 8/2016 | Germann | ............... | G01D 5/204 |
| 2017/0227592 A1* | 8/2017 | Berler | .................... | G01R 31/62 |
| 2019/0277805 A1* | 9/2019 | Wrobel | ................ | G01N 29/032 |

FOREIGN PATENT DOCUMENTS

| | | | |
|---|---|---|---|
| CN | 109188104 A | 1/2019 |
| CN | 109844469 A | 6/2019 |
| CN | 111712695 A | 9/2020 |
| EP | 3521786 A1 | 8/2019 |

OTHER PUBLICATIONS

Eaton Electrical Predictive Diagnostic, "Installation Manual (V6.0) for TBS-2 sensors," Version 6, Jun. 2004, 18 pages.
Extended European Search Report dated May 13, 2020 for European Patent Application No. 19212223.2, 8 pages.
First Office Action for Chinese Patent Application No. 202080082863.1, mailed Nov. 26, 2024, 7 pages.

* cited by examiner

110

214

216

220

218

212

210

106

300

SMART ELECTRICAL BUSHING WITH INTEGRATED SENSOR

CROSS REFERENCE TO RELATED APPLICATIONS

This application is a 35 U.S.C. § 371 national stage application of PCT International Application No. PCT/EP2020/083366 filed on Nov. 25, 2020, which in turn claims foreign priority to European Patent Application No. 19212223.2, filed on Nov. 28, 2019, the disclosures and content of which are incorporated by reference herein in their entirety.

FIELD OF THE DISCLOSURE

Embodiments of the present disclosure generally relate to an electrical bushing for medium and high voltage, especially in a medium- or high-voltage transformer. In particular, embodiments of the present disclosure relate to an electrical bushing having a fluid filled insulation volume within the bushing, especially a bushing filled with an insulation liquid such as oil and/or ester. Further, embodiments of the present disclosure relate to a method for detecting a failing bushing. Particularly, embodiments of the present disclosure relate to a method for detecting decays of properties that may indicate a possible failure of the bushing before the bushing fails.

TECHNICAL BACKGROUND

High-voltage transformers typically include a number of electrical bushings provided therein to facilitate isolation of conductors passing through a barrier, such as a grounded transformer housing. Electrical bushings for high-voltage applications may include a dielectric body component, a means for mounting the bushing to a mounting surface, and a conductor traversing the dielectric body component. The dielectric body component may be comprised or be at least partially immersed in an insulating fluid, such as e.g. oil. Examples of such bushings are oil impregnated paper insulated bushings filled with a fluid, such as e.g. oil or ester fluids.

In existing electrical bushings, the insulation fluid, such as e.g. oil or ester fluids, ages with time due to e.g. heat, moisture intake or leakage. The worst-case scenario for ageing is a failing electrical bushing.

Therefore, the status of the electrical bushing typically needs to be periodically inspected and maintained. Inspection of the electrical bushing is achieved by taking a fluid sample to be measured in a dedicated laboratory. In most cases, the laboratory is off site or run by an external laboratory service provider.

With such measurements, a sample of the fluid is typically taken in certain time intervals and sent to a dedicated laboratory for being checked for signs of ageing. However, this method is cumbersome and is realistically possible only for relatively coarse time intervals. There is a need for an improved failure prevention in electrical bushings.

SUMMARY OF THE DISCLOSURE

In view of the above, an electrical bushing for medium and high voltage is provided that overcomes or reduces at least some of the above disadvantages.

An aspect of the present disclosure provides an electrical bushing for medium and high voltage. The electrical bushing comprises a fluid filled insulation volume, and a sensor unit in contact with the fluid in the fluid filled insulation volume, wherein the sensor unit is configured to measure a breakdown voltage of the fluid.

A further aspect of the present disclosure provides a method for detecting a failing bushing. The method comprises acquiring sensor data, the sensor data describing a breakdown voltage of fluid in an electrical bushing, determining a breakdown flag, the breakdown flag that describes whether the sensor data has passed a threshold for the breakdown voltage of the fluid in the electrical bushing; and issuing a control signal based on the breakdown flag.

The data network may be an Ethernet network using TCP/IP such as LAN, WAN or Internet. The data network may comprise distributed storage units such as a cloud. Depending on the application, the cloud can be in form of public, private, hybrid or community cloud.

The embodiments described in the present disclosure allow for monitoring the electrical bushing. Based on the information gained with the monitoring, the bushing may be taken out of service. Advantageously, a (potential) failing of the electrical bushing may be detected before damage is inflicted on the electrical bushing and/or the transformer having the electrical bushing. A rapid decline of fluid quality due to ageing may be detected. Further, subsequent or upstream components of the electrical grid may be better protected by detecting a potentially failing electrical bushing earlier.

Further advantages, features, aspects and details that can be combined with embodiments described herein are evident from the dependent claims, claim combinations, the description and the drawings.

BRIEF DESCRIPTION OF THE FIGURES

The details will be described in the following with reference to the figures, wherein.

DETAILED DESCRIPTION OF THE FIGURES AND OF EMBODIMENTS

Figure 1:
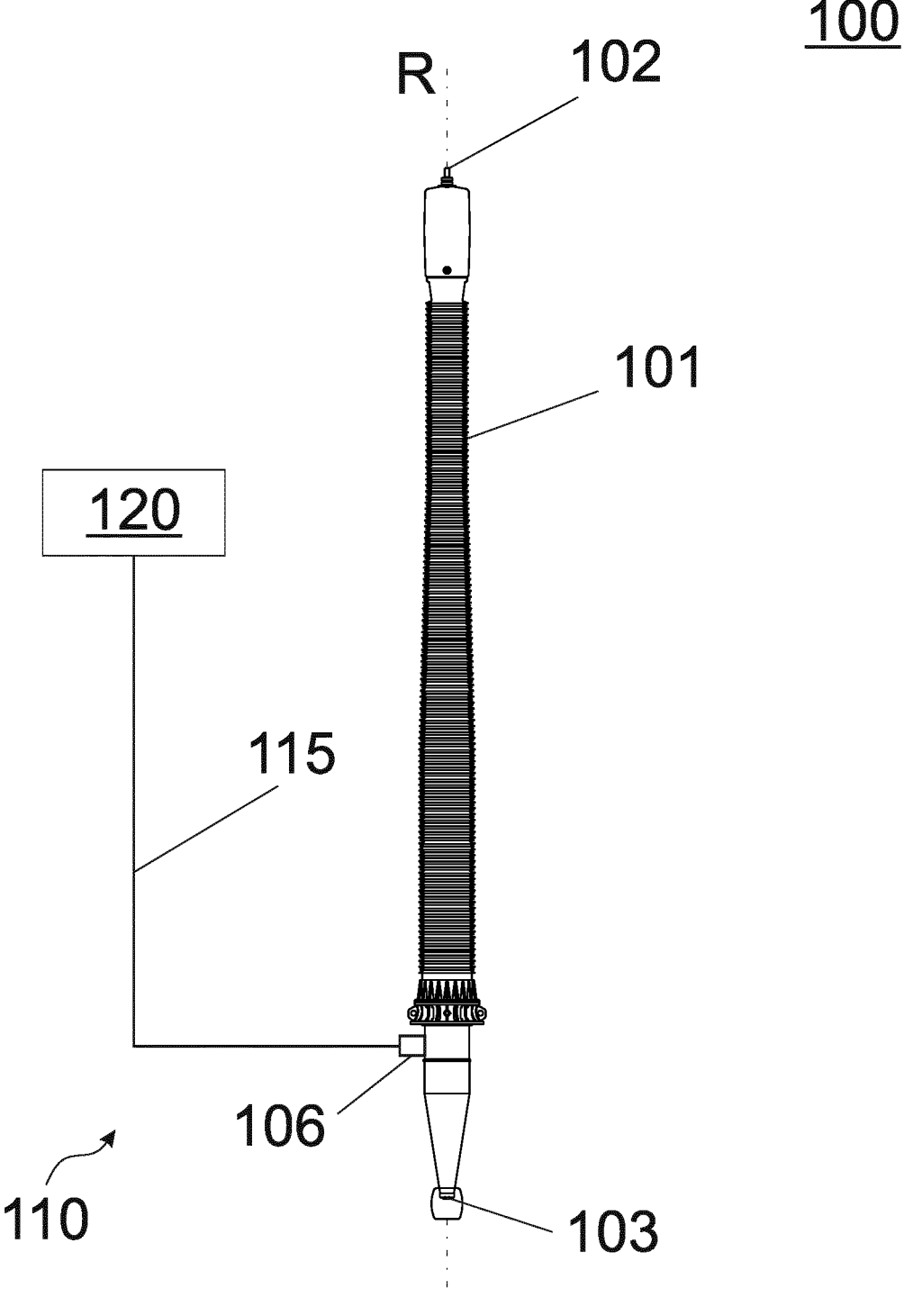
FIG. 1 is a schematic side view of an electrical bushing according to embodiments of the disclosure.

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations, with the scope thereof for which protection is sought being defined by the claims.

Within the following description of the drawings, the same reference numbers refer to the same or to similar components. Generally, only the differences with respect to the individual embodiments are described. Unless specified otherwise, the description of a part or aspect in one embodiment can be applied to a corresponding part or aspect in another embodiment as well.

According to some embodiments, which can be combined with other embodiments described herein, an electrical bushing for medium and high voltage includes a fluid filled insulation volume. The electrical bushing may comprise a sensor unit in contact with the fluid in the fluid filled insulation volume. The sensor unit may be in sensing contact with the fluid in the fluid filled insulation volume. The sensor unit may be configured to measure a breakdown voltage of the fluid. The electrical bushing may further comprise a controller connected to the sensor unit. The controller may be connected to a (cloud) computer.

A fluid as used herein may refer to a material, an element or a compound in a gaseous state. A fluid may alternatively refer to a material, an element or a compound in a liquid phase (or state). For electrical transformer and bushing applications, a fluid, as used herein, may generally refer to a liquid.

The controller may be connected to a computer or a cloud computer. A computer or a cloud computer may refer to at least one processing unit or a plurality of processing units. A computer or a cloud computer may further refer to ASICs, or any other processing unit configured to receiving an analog or a digital input for processing, such as e.g. determining a breakdown flag or a service flag. The sensor unit and/or the controller may be referred to as online sensor or online controller, i.e. that the sensor unit and/or the controller is connected to a network in order to perform online measurements, according to the specifications of the sensor unit. Online measurements may refer to measurements during operation of the electrical bushing. The sensor unit may measure a breakdown voltage in real-time and/or in substantially real-time. The sensor unit may measure a breakdown voltage upon request of the controller. The sensor unit may measure the breakdown voltage in time intervals of one or more measurements per week or one or more measurements per month. The sensor or the controller may be (referred to as) cloud connected.

The sensor unit may comprise a sensor and a determining circuit. "Measuring breakdown voltage of the fluid" also includes sensing a quantity indicative of the breakdown voltage by the sensor, that quantity allowing determining the breakdown voltage therefrom (e.g., by multiplication with a proportionality factor). "Measuring breakdown voltage of the fluid" may include determining the breakdown voltage from that quantity by the determining circuit. In this case the determining circuit is considered to be part of the sensor unit. The location of the sensor unit is defined by the sensor, even if the determining unit is located in a different location.

The breakdown voltage of the fluid may be measured or determined in kV/mm. The sensor may for example be the sensor as provided in the TrafoStick™ by A. Eberle GmbH & Co. KG or a sensor with an analogous measuring principle. The TrafoStick™ measures a breakdown voltage with an electro-acoustical sensor that includes an aluminum coated piezoelectric resonator. The sensor unit of the TrafoStick™ further includes a humidity sensor and a temperature sensor.

The measured breakdown voltage may differ somewhat from an actual breakdown voltage, e.g., due to tolerances and measurement inaccuracies. Still, not any output value can be regarded as a measured breakdown voltage. One condition is that the measured value is interpreted and further processed as a breakdown voltage.

The electrical bushing may have a top portion and a bottom portion. The bottom portion may be adapted for being connected to a transformer. The bottom portion of the electrical bushing may be adapted for being inserted into an opening of a transformer housing. The transformer housing may have a mounting portion for receiving a bottom portion of the electrical bushing.

The sensor unit may be installed on a side of the electrical bushing. The sensor unit, respectively the sensor of the sensor unit may be installed on a side of the electrical bushing. The sensor unit may be installed on a side of the electrical bushing, such that the sensor unit is laterally displaced from a line (longitudinal axis) that connects a top portion of the bushing with a bottom portion of the bushing.

The sensor unit as referred to herein may refer to at least the sensor of the sensor unit. The sensor unit may comprise at least one sensor or a plurality of sensors for measuring a breakdown voltage. The sensor unit may further comprise a sensor unit controller in data communication with the sensor or the plurality of sensors. The sensor or the plurality of sensors may be combined in one sensor unit housing. The sensor unit controller may be comprised in the sensor unit housing. The sensor(s) and the sensor unit controller may be spaced apart or have different housings connected or integrated with the electrical bushing. This may be referred to as sensor unit herein. For example, the sensor may be installed on the bushing at a location that is optimal for measuring e.g. a breakdown voltage. The sensor unit controller may be installed at a different location, e.g., spaced apart from the bushing. This location of the controller may be advantageous for reducing, for example, electromagnetic influences. The senor unit controller may therefore be located where electromagnetic influences are reduced. A sensor unit controller and a sensor located at different locations of the bushing may be referred to as sensor unit.

According to some embodiments, which can be combined with other embodiments described herein, the sensor unit may be wirelessly connected to the controller. The senor unit may be connected to the controller by a wire, such as e.g. a copper wire or an optical fiber, such as a glass fiber cable. The sensor unit may comprise an energy harvesting module for powering the sensor unit. The sensor unit may transmit a measured breakdown voltage to the controller in a wireless manner or wirelessly. At least one of the sensor and the sensor unit may be wirelessly connected to the controller for transmitting the sensed value (data) indicative of the breakdown voltage to the controller. Determining a breakdown voltage may at least partially be performed in the sensor unit controller. Determining a breakdown voltage may at least partially be performed in the controller.

The sensor unit may be installed in a cavity of the flange that connects the electrical bushing to a transformer housing. The sensor unit may be installed in an expansion vessel when the sensor unit is installed in the bushing head. A bushing head corresponds to a top portion of the electrical bushing. The sensor unit may be housed in one or more protrusions. A protrusion for a sensor unit may be substantially perpendicular to a longitudinal axis, such as the line connecting a top portion and a bottom portion of the electrical bushing. The protrusion may extend in a substantially radial direction from the bushing.

The controller may be connected to a network through a network interface for connecting the controller to a data network. The connection may be a wireless connection. The controller may be operatively connected to the network interface for at least one of carrying out a command received from the data network and sending status information of the electrical bushing to the data network. The controller may comprise a processing unit for converting a measured breakdown voltage into a digital signal. The measured breakdown voltage may be converted into a digital signal by a processing unit of the sensor unit or the sensor.

The sensor unit of the electrical bushing may further be configured to measure at least one of a pressure, a temperature, a moisture level of moisture content in the fluid and a density of the fluid in the electrical bushing. The sensor unit may have a plurality of sensors that each measure a different parameter. The sensor unit may comprise sensors that measure two or more of a pressure, a temperature, a moisture level of moisture content in the fluid and a density of the fluid in the electrical bushing. The sensors of the sensor unit may be located at different locations on or in the electrical bushing for measuring a respective parameter. For example, a temperature sensor may be placed in a top portion of the electrical bushing and a breakdown voltage sensor may be located in a bottom portion of the electrical bushing.

According to an aspect, the electrical bushing may further comprise a network interface for connecting the sensor unit to a data network, in particular a global data network. The data network may be a TCP/IP network such as the Internet. The sensor unit is operatively connected to the network interface for carrying out commands received from the data network. The commands may include a control command for controlling the device to carry out a task such as measuring the breakdown voltage of the fluid in the electrical bushing. In this case, the sensor unit is adapted for carrying out the task in response to the control command. The commands may include a status request. In response to the status request, or without prior status request, the sensor unit may be adapted for sending a status information to the network interface, and the network interface is then adapted for sending the status information over the network. The commands may include an update command including update data. In this case, the sensor unit is adapted for initiating an update in response to the update command and using the update data. For example, un update command may set parameters of the sensor unit, such as e.g. a pre-determined threshold or a pre-determined setting for e.g. a fluid to be measured. The above may also apply to a controller connected to the sensor unit.

FIG. 1 exemplarily depicts an electrical bushing 100. The electrical bushing 100 includes a body element 101. Body element 101 may have a substantially rotationally symmetrical form about a longitudinal axis R. Body element 101 serves to electrically isolate one or more conductors. The body element 101 may provide electrical isolation of one or more conductors by, for example, including a non-conductive or dielectric material. Particularly, body element 101 may be at least partially immersed in an isolating medium, for example a dielectric fluid.

The electrical bushing may include a number of terminals. As exemplarily shown in FIG. 1, electrical bushing 100 includes an upper terminal 102 in an upper portion of the electrical bushing 100 and a lower terminal 103 in the bottom portion of the electrical bushing 100. Upper terminal 102 and lower terminal 103 may be configured for mounting at least one conductor thereto. For example, upper terminal 102 and lower terminal 103 may include a threaded portion configured for receiving at least one fastener for securely mounting at least one conductor thereto. Upper terminal 102 and lower terminal 103 may be respective upper and lower ends of a conductor passing through electrical bushing 100.

Electrical bushing 100 may be used in medium-voltage or high-voltage applications. In the context of the present disclosure, the term "medium-voltage" may refer to a voltage of at least 1 kV and up to 52 kV. Further, the term "high-voltage" in the context of the present disclosure may refer to a voltage of at least 52 kV.

Body element 101 includes a protrusion 106. Protrusion 106 protrudes from body element 101 in a substantially radial direction from an outer surface of body element 101, i.e. in a direction substantially perpendicular to longitudinal axis R. Protrusion 106 allows for body element 101 to be equipped with a sensor unit 110. As exemplarily shown in FIG. 1, protrusion 106 engages with the bushing such that a sensor unit 110 with its respective sensor(s) may be in contact with the fluid in the electrical bushing. The sensor unit 110 is connected to a controller 120 through a data connection 115. The data connection 115 may be a wired or a wireless connection.

According to an embodiment, which may be combined with other embodiments described herein, a transformer assembly for medium and high voltage may be provided. The assembly may comprise a transformer having a transformer housing. The assembly may comprise an electrical bushing according to embodiments described herein.

The assembly may have a sensor unit located on a portion of the electrical bushing that is located within the opening of the transformer housing. For example, the sensor unit may, when the bushing is installed on the transformer, be submerged in transformer fluid. The sensor unit may be adapted to withstand influences of the transformer fluid. The sensor unit may therefore be in a sealed protrusion of the bushing or in an expansion vessel.

The electrical bushing may comprise a shielding structure for shielding the senor unit, e.g. a sensor unit in the bottom portion of the electrical bushing, from electromagnetic influences of the transformer. The shielding structure advantageously provides electromagnetic shielding, such that a wireless or wired signal may be transmitted from the sensor or the sensor unit in a substantially undisturbed manner. The shielding structure may advantageously provide a better signal to noise ratio of a measurement.

The electrical bushing may comprise a seal or sealed container (vessel) that keeps a transformer fluid, such as e.g. oil or ester fluids, from contacting the sensor.

Figure 2:
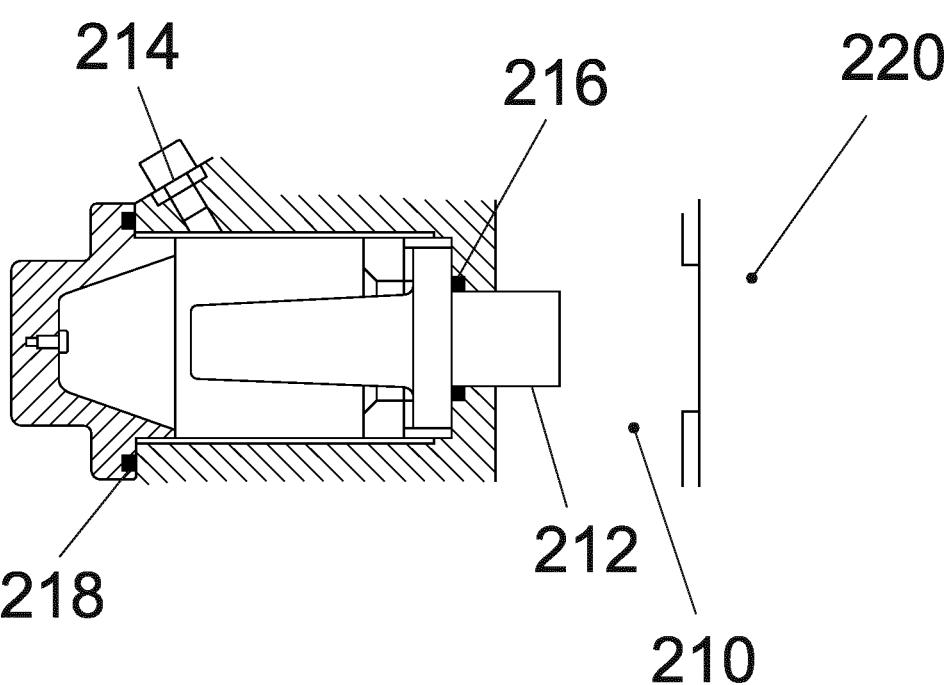
FIG. 2 is a schematic cross-sectional view of a sensor unit according to an embodiment of the disclosure.

FIG. 2 exemplarily depicts a sensor unit 110. The senor unit 110 is mounted inside a protrusion 106 of the electrical bushing. The sensor unit 110 has a sensor 212 that is in (sensing-)contact with the fluid inside the fluid filled insulation volume 210 of the electrical bushing. The protrusion 106 may have, as exemplarily depicted, a port 214 that may be used to connect the sensor unit 110 with a wire that may be connected to a controller or that may be used to service the sensor unit 110. The fluid in the fluid filled insulation volume 210 surrounds a core of the bushing 220. The sensor unit 110 is sealed off from the fluid with seals 216. A further seal 218 seals a cover of the protrusion 106 form environmental influences, such as e.g. rain or moisture.

According to yet another aspect of the present disclosure, a method for detecting a failing electrical bushing according to embodiments of the present disclosure is provided.

The method comprises acquiring sensor data, the sensor data describing a breakdown voltage of fluid in an electrical bushing. The method may further comprise determining a breakdown flag, the breakdown flag describing whether the sensor data has passed a threshold for the breakdown voltage of the fluid in the electrical bushing. The breakdown flag may describe that a trend of the sensor data indicates that the electrical bushing will fail in a pre-determined time interval. The method may comprise issuing a control signal based on the breakdown flag.

Issuing a control signal as described herein may refer to issuing a control signal to at least one of the transformer assembly, a cloud computer, such as e.g. a server, a controller of the transformer assembly and a user interface provided by a cloud computer or a computer screen. Issuing a control signal based on the breakdown flag may refer to evoking an acoustic or optical signal when a threshold for a (pre-determined) value for a breakdown voltage has been crossed.

According to some embodiments, which can be combined with other embodiments described herein, the method may comprise acquiring transformer data. The transformer data may describe a state of the transformer. The method may comprise determining a service flag. The service flag may describe whether a transformer assembly has passed a servicing threshold. The determining the service flag may be based on the state of the transformer data and the breakdown flag of the electrical bushing.

The service flag of the transformer assembly may be based on determining a thermal state of the transformer assembly. The means for determining a thermal state of the transformer assembly may refer to a determination device, e.g. a computation unit or a computer, such as e.g. a controller or a cloud computer.

In operation, losses in electric transformers (e.g., iron and copper loss) contribute to heat development inside the transformers and on their surfaces. Electric transformers include cooling devices for heat dissipation. The cooling devices are configured to circulate a liquid coolant, such as a mineral, ester or silicone fluid, through at least one liquid coolant channel. The coolant channel is arranged such that it can absorb exhaust heat from the electric transformer, for example by conducting the coolant channel through the interior of the transformer and/or on a surface of surfaces thereof.

To determine a thermal state of an electric transformer, not only the temperature of the coolant upstream of the electric transformer and the temperature of the coolant downstream of the electric transformer, but also the temperature of the airstream upstream of heat spreaders and the temperature downstream of heat spreaders may be used in the determination of the thermal state of the electric transformer.

For the determination, a sensor may be placed at key points of the coolant circulation and/or the heat spreaders. A key point may be a point, where a maximum or a minimum temperature is to be expected.

The sensor signals of the respective sensors in the electric transformer and its components may be received by a computation unit or may be sent to the computation unit. The computation unit then determines the thermal state of the components of the electric transformer. Further, the computation unit may determine a thermal state of the electric transformer by a combination of the components' individual thermal states and/or a weighted combination of thermal states. The thermal state of the electric transformer may be compared to a pre-determined threshold for a thermal state of the electric transformer to determine a service flag.

In the embodiments described herein, it is conceivable that the computation unit is adapted to determine the thermal state repeatedly, such as in predetermined time intervals. In this regard, the computation unit may further be configured to store a time series of thermal states in a memory, for example a volatile or a non-volatile memory such as a RAM, a flash memory, a hard disc drive etc. For example, the thermal state may be determined in intervals such as every ten seconds, every minute, every ten minutes or the like, and stored in the memory as time-series data. It is conceivable to store the time series of the thermal state in a circular buffer of an appropriate size. For example, the thermal state may be determined in real-time or substantially real-time. Samples with a pre-determined sample rate may be sent to a (cloud) computer.

The service flag may be based on at least one of a thermal state of the electric transformer and a non-thermal state of the electric transformer. A non-thermal state of the electric transformer may for example refer to measurements from a pressure sensor, temperature sensor, moisture sensor for measuring a moisture content of the transformer fluid, and/or a sensor for measuring the density of the transformer fluid.

A non-thermal state of the electric transformer may for example refer to an acceleration of the transformer assembly. A sensor may measure an acceleration of the electrical bushing or the transformer assembly due to wind or earth movements, such as movements that occur e.g. with an earthquake.

The related measurement data may be sampled and stored in a memory, for example a volatile or a non-volatile memory such as a RAM, a flash memory, a hard disc drive etc. For example, the measurement data may be sampled in appropriate intervals, such as every second, every ten seconds, every minute, every ten minutes or the like, and stored in the memory as time-series data. The data may be sampled in real-time or substantially real-time. It is conceivable to store the measurement data in a circular buffer of an appropriate size. Also, it is conceivable to use a limited amount of past data for determining the respective expected environmental condition, such as all the data or parts of the data each relating to the past one hour, past two hours, past five hours etc.

Embodiments of the disclosure may for example be used in an insulation-liquid filled bushing, in particular an oil-filled bushing such as a mineral oil filled bushing. The bushing may be rated for a voltage of at least 0.5 MV or even at least 1.0 MV, such as a 1.2 MV bushing. The bushing may be an AC or DC bushing.

The bushing may for example be a transformer bushing and/or wall bushing. In particular, the bushing may be adapted for being connected to a transformer or a wall, and in particular for being inserted into an opening of a transformer housing or a wall.

A forecast environmental condition may be determined based on a weather forecast that is valid for a location or site at which the transformer assembly or transformer is located. For example, the forecast environmental condition may be obtained from a weather forecast service via a data network, such as the internet. As one example, a forecast ambient temperature may be obtained from the weather forecast service via the data network. As a second example, a forecast mean value of solar radiation is obtained from the weather forecast service via the data network. The forecast environmental conditions may be determined for a future point in time; likewise, the forecast environmental conditions may be determined for a future time interval as time-series data or as mean data, such as arithmetic mean values of data.

At least one of the thermal state, the non-thermal state of the transformer, and forecast environmental conditions may be evaluated to determine a state of the transformer.

According to some embodiments, which can be combined with other embodiments described herein, the method may comprise servicing the electrical bushing based on the control signal and/or the service flag. Advantageously, a failing or a process of failing may be detected earlier with the described method. The assembly may advantageously be more robust with an online surveillance of a breakdown voltage of the fluid in the fluid filled insulation volume.

According to some embodiments, which can be combined with other embodiments described herein, the method may comprise servicing the electrical bushing and/or the transformer assembly based on the control signal and/or the service flag.

Figure 3:
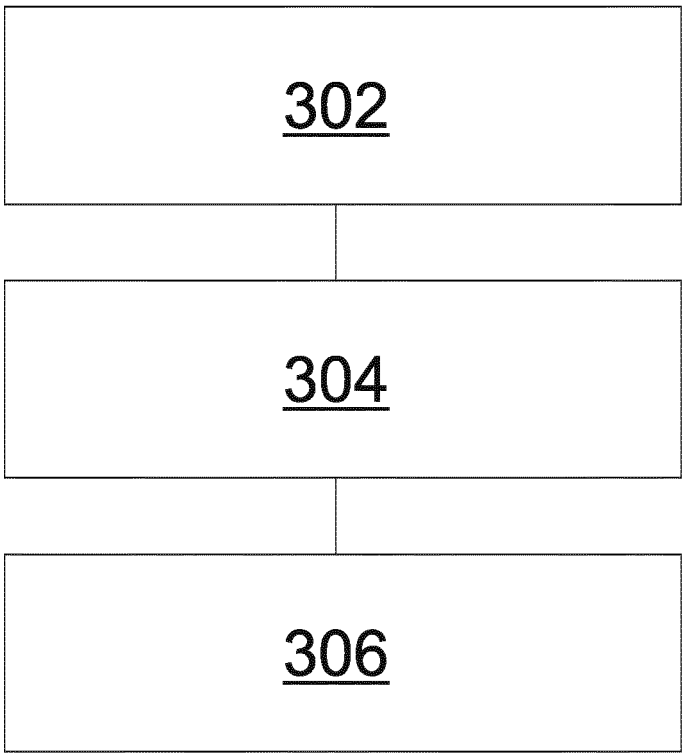
FIG. 3 is a flowchart of a method for detecting a failing electrical bushing according to an embodiment of the disclosure.

Reference is now made to FIG. 3, which shows a flow-chart of method 300. Block 302 comprises acquiring sensor data. The sensor data may describe a breakdown voltage of a fluid in the electrical bushing. Block 304 describes determining a breakdown flag. The breakdown flag may describe whether the sensor data has passed a threshold for the breakdown voltage of the fluid in the electrical bushing. Block 306 describes issuing a control signal based on the breakdown flag.

The disclosure advantageously eliminates the need for on-site monitoring of the electrical bushing and/or the transformer assembly. The electrical bushing and/or the transformer assembly may advantageously be monitored from afar.

Further, the disclosure advantageously reduces the costly manual bushing quality checks. Consequentially, maintenance cost, the risk of unexpected failures of the bushing may advantageously be lowered. A further advantage is that a bushing may be replaced before failure such that costly failures of critical or key device may be prevented.

While the foregoing is directed to aspects and embodiments of the disclosure, other and further embodiments of the disclosure may be devised without departing from the basic scope thereof, and the scope thereof is determined by the claims that follow.

The invention claimed is:

1. Electrical bushing for medium and high voltage, the bushing comprising:
   a fluid filled insulation volume; and
   a sensor unit in contact with the fluid in the fluid filled insulation volume, the sensor unit configured to measure a breakdown voltage of the fluid,
   wherein the sensor unit is mounted in a radial protrusion that extends from a body of the electrical bushing and is in contact with the fluid, wherein the radial protrusion is formed by and extends from the body of the electrical bushing, the radial protrusion defining a portion of the fluid filled insulation volume of the electrical bushing.

2. The electrical bushing according to claim 1, wherein the bushing has a top portion and a bottom portion, wherein the bottom portion is adapted for being connected to a transformer.

3. The electrical bushing according to claim 1, wherein the radial protrusion is sealed relative to the bushing body and forms a pressure-tight extension of the fluid filled insulation volume.

4. The electrical bushing according to claim 2, wherein the radial protrusion is located in the bottom portion of the electrical bushing.

5. The electrical bushing according to claim 1, wherein the sensor unit is wirelessly connected to a controller for transmitting the measured breakdown voltage to the controller.

6. The electrical bushing according to claim 5, wherein the controller is connected to network through a network interface for connecting the controller to a data network, wherein the controller is operatively connected to the network interface for at least one of carrying out a command received from the data network and sending status information of the electrical bushing to the data network;
   wherein the controller optionally comprises a processing unit for converting a measured breakdown voltage into a digital signal.

7. The electrical bushing according to claim 1, wherein the sensor unit is further configured to measure at least one of a pressure, a temperature, a moisture level of moisture content in the fluid and a density of the fluid in the electrical bushing.

8. The electrical bushing according to claim 2, wherein the bottom portion is adapted for being inserted into an opening of a transformer housing.

9. The electrical bushing according to claim 2, wherein the sensor unit is installed in the bottom portion of the electrical bushing to be inserted into an opening of a transformer housing.

10. A transformer assembly for medium and high voltage, the assembly comprising:
   a transformer having a transformer housing; and
   an electrical bushing comprising:
      a fluid filled insulation volume; and
      a sensor unit in contact with the fluid in the fluid filled insulation volume, the sensor unit configured to measure a breakdown voltage of the fluid,
      wherein the sensor unit is mounted in a radial protrusion that extends from a body of the electrical bushing and is in contact with the fluid, wherein the radial protrusion is formed by and extends from the body of the electrical bushing, the radial protrusion defining a portion of the fluid filled insulation volume of the electrical bushing.

11. The transformer assembly according to claim 10, wherein the sensor unit is located on a portion of the bushing that is located within an opening of the transformer housing.

12. The transformer assembly of according to claim 10, wherein the bushing comprises a shielding structure for shielding a sensor of the sensor unit from electromagnetic influences of the transformer.

13. The transformer assembly of according to claim 10, wherein the bushing comprises a seal that keeps a transformer fluid in the transformer from contacting the sensor of the sensor unit.

14. The transformer assembly according to claim 10, wherein the bushing has a top portion and a bottom portion, wherein the bottom portion is inserted into an opening of the transformer housing.

15. The transformer assembly according to claim 14, wherein the radial protrusion is located in the bottom portion of the electrical bushing.

16. The transformer assembly according to claim 10, wherein the radial protrusion is located on a side of the bushing.

17. The transformer assembly according to claim 10, wherein the sensor unit is wirelessly connected to a controller for transmitting the measured breakdown voltage to the controller.

18. A method for detecting a breakdown flag indicative of a failing medium or high voltage bushing having a fluid filled insulation volume, the method comprising
   acquiring sensor data by a sensor unit of the bushing, the sensor unit being in contact with a fluid in the fluid filled insulation volume, the sensor data describing a breakdown voltage of the fluid, wherein the sensor unit is mounted in a radial protrusion that extends from a body of the electrical bushing and is in contact with the fluid, wherein the radial protrusion is formed by and extends from the body of the electrical bushing, the radial protrusion defining a portion of the fluid filled insulation volume of the electrical bushing;

determining a breakdown flag, the breakdown flag describing whether the sensor data has passed a threshold for the breakdown voltage of the fluid in the bushing; and issuing a control signal based on the breakdown flag.

19. The method according to claim 18, the method comprising acquiring transformer data, the transformer data describing a state of the transformer, determining a service flag, the service flag describing whether the transformer has passed a servicing threshold based on the state of the transformer data and the breakdown flag.

20. The method according to claim 18, wherein the method comprises servicing the bushing based on the control signal and/or the service flag.

* * * * *